United States Patent [19]

Hammer

[11] 4,049,857

[45] Sept. 20, 1977

[54] DEPOSITION MASK AND METHODS OF MAKING SAME

[75] Inventor: Robert Hammer, Brookfield Center, Conn.

[73] Assignee: International Business Machines Corporation, Armonk, N.Y.

[21] Appl. No.: 709,357

[22] Filed: July 28, 1976

[51] Int. Cl.$^2$ .................. B32B 3/10; B05D 5/00; B05C 11/16

[52] U.S. Cl. .................. 428/136; 118/48; 118/504; 427/99; 427/282

[58] Field of Search .............. 428/131, 132, 134, 136, 428/167; 118/504, 505, 48, 49, 49.1, 49.5; 427/82, 96, 99, 282

[56] References Cited

U.S. PATENT DOCUMENTS

| | | | |
|---|---|---|---|
| 3,330,252 | 7/1967 | Oberg | 118/49.1 |
| 3,678,892 | 7/1972 | Fairchild | 118/504 |
| 3,724,420 | 4/1973 | Quinn | 118/505 |
| 3,841,261 | 10/1974 | Hudson et al. | 118/505 |
| 3,897,324 | 7/1975 | Del Monte et al. | 118/504 |
| 4,021,276 | 5/1977 | Cho et al. | 428/134 |

*Primary Examiner*—William R. Dixon, Jr.

*Attorney, Agent, or Firm*—Charles P. Boberg

[57] ABSTRACT

The invention provides a reinforced mask which enables closely spaced strips or other narrowly separated parts of a deposited pattern to be formed upon a substrate by a non-line-of-sight deposition process (such as ion plating or sputter deposition) without causing unwanted voids or discontinuities to appear in the deposited pattern at points that underlie the reinforcing ribs on the mask. The mask is formed by a selective material removing process that produces a thin web adjoining one or more relatively thick ribs that provide rigidity to the web. In those parts of the mask where the reinforcing ribs extend across slots or other openings in the web, the masking material is removed to a depth which exceeds the web thickness, thus raising the undersides of the ribs above the web surface to provide clearance for the vaporized material which is being deposited upon the substrate through the mask openings so that this material has ready access to points located directly beneath the ribs as well as points that are between the ribs. The ribs therefore can serve their reinforcing function without producing unwanted voids or thin spots in the deposited pattern.

2 Claims, 3 Drawing Figures

DEPOSITION MASK AND METHODS OF MAKING SAME

BACKGROUND OF THE INVENTION

This invention relates to masks which are employed in vapor deposition processes to form desired patterns of deposited materials, and it relates particularly to masks which are designed to form patterns containing very closely spaced parts, such as the sets of parallel conductors that are deposited upon glass plates in gas panel display devices, for example.

Masks of the kind just described must be thin enough to produce high-resolution patterns; yet they also must maintain accurate positioning of parts which have little or no inherent rigidity, such as the very narrow strips separating the closely spaced slots through which gas panel conductors are to be deposited. To hold such parts in place, the mask may be provided with reinforcing ribs that extend across the closely spaced openings and are integral with or joined to the intervening parts which narrowly separate these openings. However, the provision of such ribs is likely to introduce a problem which could be described as "shadowing" or the "stencil effect". At each point where a reinforcing rib extends across a relatively narrow opening in the mask, the rib will tend to obstruct the deposition of vaporized coating material through that opening. In commonly used line-of-sight deposition processes such as electron beam deposition, the presence of such an obstruction across a narrow opening will cause a void or thin spot to appear in the deposited pattern, thereby complicating the task of fabricating an acceptable pattern.

SUMMARY OF THE INVENTION

An object of the present invention is to enable a circuit pattern containing many closed spaced parts to be accurately deposited through a reusable mask of ribbed construction without encountering the "shadow" problem mentioned above.

The invention is based upon the discovery that non-line-of-sight deposition methods such as ion plating and sputter deposition can be successfully employed in conjunction with a reinforced mask to fabricate circuit patterns of the kind described above if the reinforcing ribs of the mask are formed with suitable indentations or notches therein at the various points where these ribs extend across openings in the mask, thereby effectively raising the undersides of the ribs at places where they bridge these openings so as to provide adequate clearance for the deposition of material upon parts of the subsrate that otherwise would be shielded by the ribs. The invention enables a mask structure of this type to be inexpensively fabricated by a novel application of well known techniques.

These and other objects, features and advantages of the invention will be apparent from the following more particular description of a preferred embodiment of the invention, as illustrated in the accompanying drawings.

DETAILED DESCRIPTION OF A PREFERRED EMBODIMENT

Figure 1:
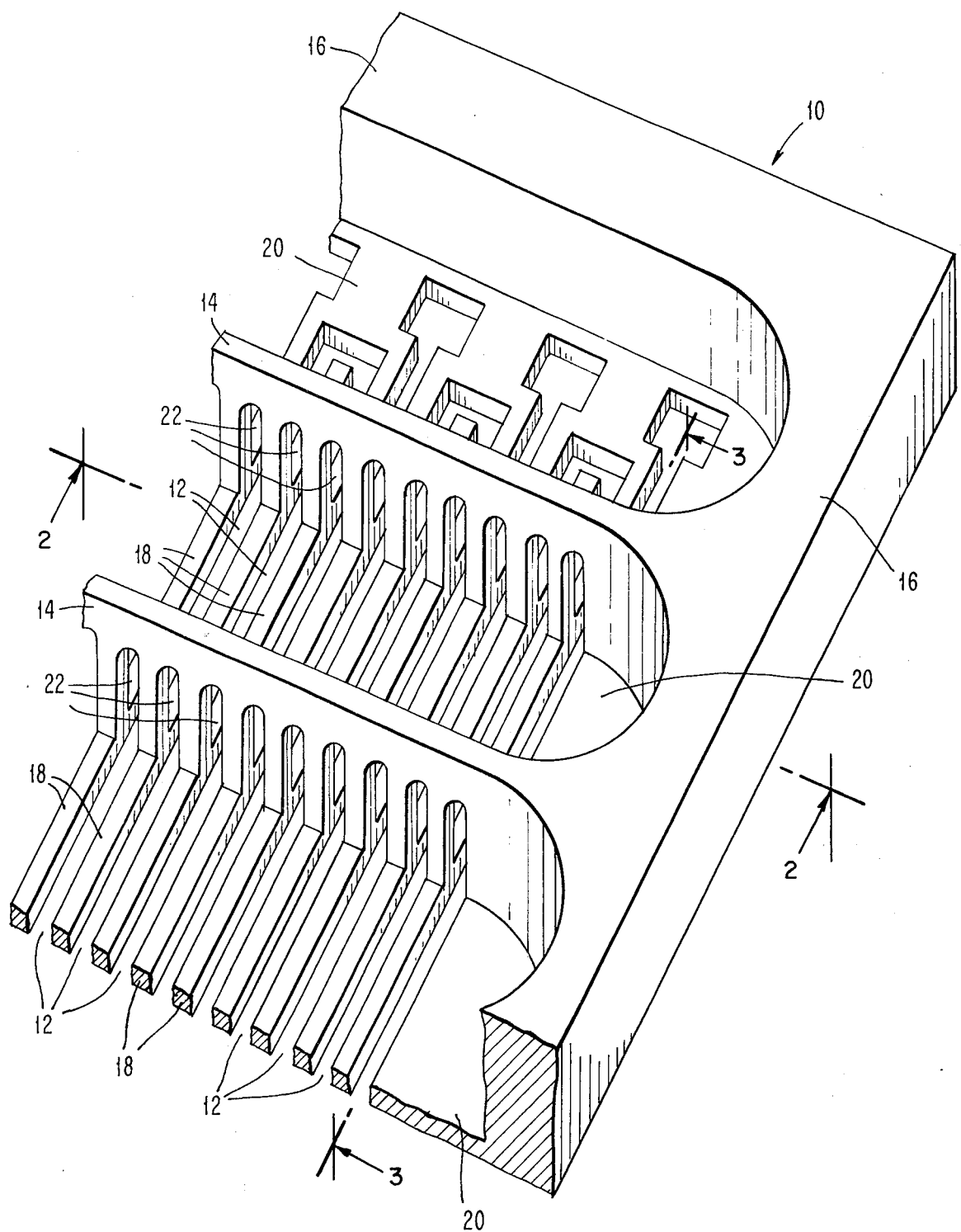
FIG. 1 is a general perspective view showing on a magnified scale a portion of a deposition mask constructed in accordance with the invention.

FIG. 1 shows a portion of an exemplary mask 10 having the type of construction which is contemplated by the invention. A mask of this kind may be used for depositing long narrow strips of conductive material in closely spaced relationship upon a substrate, such as the parallel conductors which are supported by each of the glass plates in a gas panel display apparatus. The mask is formed by a novel but relatively simple fabrication procedure from an integral workpiece having parallel surfaces. As will be explained hereinafter, the choice of fabrication procedure will depend upon the material from which the mask is to be made.

In the illustrated mask 10, which is especially designed to deposit a pattern of generally parallel conductors upon a glass substrate to be used in a gas panel display device, many long narrow openings or slots generally designated 12 are arranged parallel to each other and at right angles to a series of reinforcing ribs 14 which are connected to the long narrow portions 18 of the mask situated between various pairs of the slots 12 as shown for holding these intervening parts 18 securely in place. Additional reinforcement is provided by a solid shoulder or rim 16 extending around the periphery of the mask 10, the ends of the ribs 14 being integrally joined with the adjacent sides of this rim 16. Between each pair of adjacent ribs 14, as well as in the spaces between the end parts of rim 16 and the adjacent ones of the ribs 14, the masking material is reduced in thickness to provide a thin web portion 20. The slots 12 extend through this thin web portion 20 and the parts of the ribs 14 aligned therewith to define the pattern that will be assumed by the material which is deposited through the mask 10 onto the underlying substrate (not shown). The ribs 14 provide rigid support for the otherwise weak or pliant parts of the mask structure such as the long narrow divider strips or "islands" 18 which separate the slots 12 in the web 20. Otherwise these intervening portions 18 would be only tenuously supported or not supported at all by the thin web 20.

Figure 2:
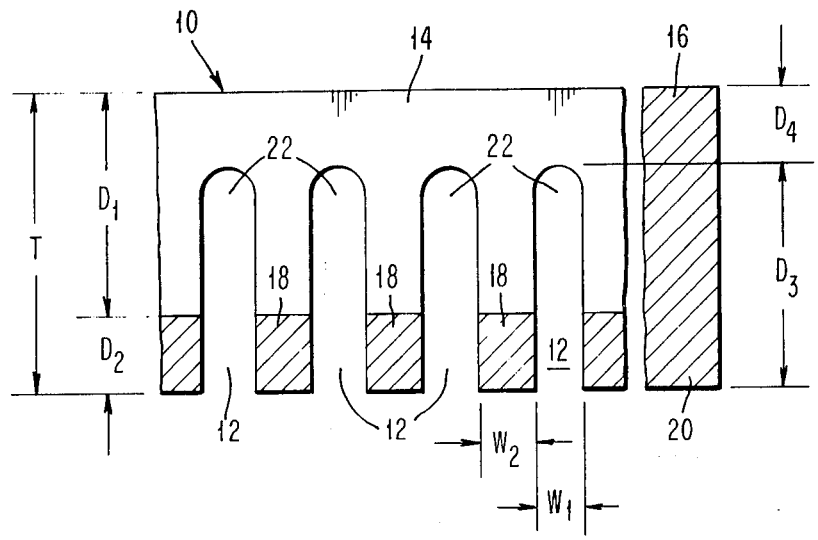
FIGS. 2 and 3 are sectional views taken on the like-numbered section lines in FIG. 1, showing various features of the mask structure.
Figure 3:
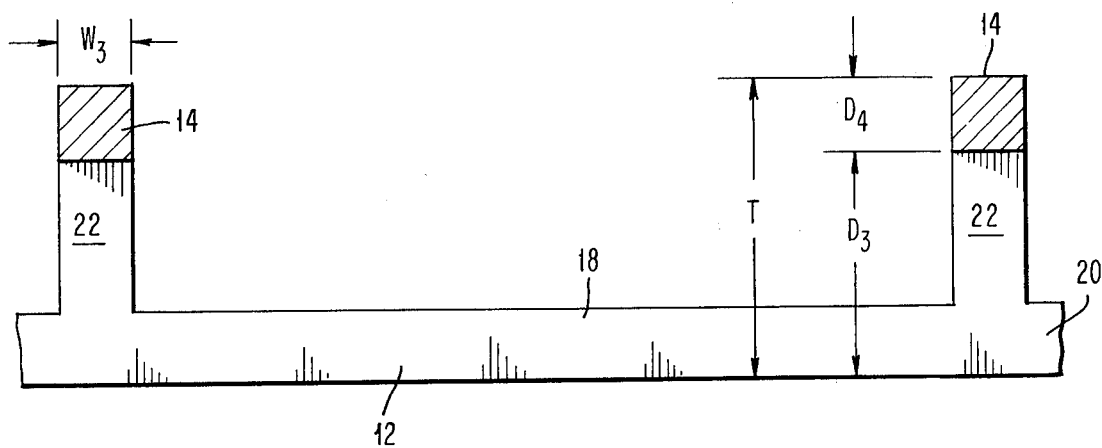

As explained above, it is desirable that the ribs 14 support the separation strips or dividers 18 in rigid fashion but without significantly obstructing the passage of the vaporous material which is being deposited through the mask onto the substrate. These conditions are met by a mask fabrication procedure which now will be described with reference to FIGS. 1-3.

A slab or plate of suitable masking material having an original thickness T (typically between 20 and 25 mils for a mask to be used in the fabrication of gas panels) is subjected on the upper side thereof to a selective material removing operation, described hereinafter, which reduces its thickness to about one-fourth (or less) of the original thickness T in those portions of the mask 10 which are to constitute the thin web 20, thus defining the ribs 14 and the rim or shoulder 16. The thickness of the material removed in this step is designated $D_1$, and the thickness of material remaining in web 20 is designated $D_2$. The suggested ratio of 3:1 for the dimensions $D_1$ and $D_2$ is, of course, subject to the discretion of the designer. A web thickness $D_2$ of 5 mils has been found suitable in practice to provide the desired high resolution of the pattern deposited through the mask.

Material now is selectively removed from the underside of mask 10 in places where mask openings such as slots 12 are required, and it is further removed from the undersides of ribs 14 in those places where these ribs extend across the slot-like openings 12 formed in the web portion 20. This rib undercutting operation effectively extends each slot 12 part way up into each of the ribs 14, forming a deep recess or notch 22 in that part of each rib which is vertically aligned with each of the slots 12 in the web 20, as shown in the drawings. A suggested ratio between the combined depth $D_3$ of the openings 12 and 22 and the remaining thickness $D_4$ of material in the notched or recessed portion of the rib 14 is 3:1, but this likewise is subject to the designer's discretion.

It is necessary that the recesses 22 in ribs 14 be large enough to provide ample clearance for the passage of vaporized coating or plating material through the slots 12 onto those parts of the substrate (not shown) which are directly underneath the ribs 14, so that the ribs 14 will not obstruct the deposition of such material onto the substrate if a non-line-of-sight deposition method is used. One such deposition method that has been used successfully in conjunction with the illustrated mask is ion plating, as described, for instance, in the article by G. J. Dale et al entitled "Ion Plating Using a Pure Ion Source", in the May 1975 issue of *Electronic Packaging and Production*, pages 39–46. In this plating process, vaporized material is ionized as it evaporates, creating a plasma which permeates the deposition chamber. Surfaces to be plated can be placed anywhere in the chamber, and deposition will occur uniformly upon those surfaces from random directions. Obstructions such as reinforcing ribs 14 will have no detrimental shadowing effect if appropriate clearance is provided between these ribs and the underlying areas of the substrate surface on which deposition is to take place. By deeply recessing the ribs 14 as indicated at 22, such clearance is provided even though the web portions 20 are made very thin in order to attain high resolution of the deposited pattern. The tendency of each rib to shadow the substrate is further reduced by the fact that the ribs 14 can be made relatively narrow, on the order of 5 mils in width, so that high resolution of the deposited pattern is obtained even in those places which are beneath the ribs 14.

In a mask used for fabricating gas panels, typical values for the various mask dimensions are as follows (FIGS. 2 and 3):

Rib thickness T — 20 mils
Web thickness $O_2$ — 5 mils
Clearance depth $D_3$ — 15 mils
Slot width $W_1$ — 4 mils
Divider width $W_2$ — 4 mils
Rib width $W_3$ — 5 mils.

By virtue of the clearance recesses or indentations 22 provided in the ribs 14, other non-line-of-sight deposition techniques such as sputter deposition also have been used to accomplish the deposition of intricate patterns which are free of unwanted voids and discontinuities in places where the reinforcing ribs 14 pass over the openings 12 in the mask 10.

Several methods may be used for fabricating masks of the type shown herein. If the mask 10 is made of material that can be cut by machine tools or eroded by other standard machining techniques such as photolith/subtractive etching or electrochemical etching, then one of these techniques is utilized to machine out the masking material in areas not covered by the ribs 14 and rim 16 to a depth $D_1$ of, say, three-quarters the original workpiece thickness T, FIG. 2, leaving a thin web portion 20 having a thickness $D_2$ which is about one-quarter the original thickness T. From the opposite side of the mask 10, in the areas where openings such as 12 are desired, any suitable one of the aforesaid methods is employed for causing the material to be removed completely through the web portion 20 and to a depth $D_3$ in the rib portions 14 equalling, for example, three-quarters of the mask thickness T, thus forming the slot-like openings 12 in the webs 20 and the combined openings 12 and 22 in the ribs 14, as herein shown, whereby the undersides of the ribs 14 are raised to a substantial distance above the surface of the web 20. The remaining thickness $D_4$ of the ribs 14 in such places is sufficient to insure the rigidity of the reinforcing rib structure and yet will offer no significant obstruction to non-line-of-sight deposition.

In the event that the mask 10 is to be made of a relatively inert material such as graphite which cannot be eroded by etching, then a different mask fabricating procedure is utilized. If the spacing between ribs is sufficiently great to accommodate a router or milling cutter (20 mils or more), such a tool may be used for removing the workpiece material to form the ribs 14, rim 16 and web 20. In places where the space is too limited for the use of machine tools (openings 12, for example), or in any other place that may be desired, an erosion technique known as "sandblasting" is employed. This involves the use of one or more streams of finely divided abrasive particles each propelled by a jet of air or other gas forced from a nozzle under high pressure through a chamber containing abrasive powder, which is picked up and carried along by the jet. The abrading action of the jet stream can be very accurately controlled to make precise cuts in materials such as graphite. If the width of the cut is less than that of the jet produced by the finest nozzle orifice, then the abrasive stream is directed through an auxiliary mask or protective coating (not shown) having openings therein which correspond in size and location to the openings that are to be formed in mask 10. This protective coating may be provided as follows:

The workpiece from which mask 10 is to be formed is covered with a thin foil of metal such as stainless steel or beryllium-copper alloy which is resistant to abrasive action but not resistant to chemical etching, this foil being bonded to the workpiece by epoxy adhesive or other suitable bonding material. Then, by a standard photolithographic technique, the metal layer is chemically etched away in those areas where mask openings are to be formed or where the workpiece thickness is to be reduced, as the case may be. Following this step, the exposed parts of the adhesive layer are removed by a suitable solvent.

The required pattern of openings and thickness reductions now is formed in the mask by sandblasting the exposed parts of the graphite or other workpiece material. After such abrading operations have been completed, the metal and adhesive layers on the remaining parts of the mask are removed by appropriate chemical methods. In the illustrated mask 10 it is assumed that the openings 12 and 22 were formed by sandblasting, and for this reason the recesses 22 are shown as having rounded upper ends.

Experiments have shown that by accurately controlling the air or gas pressure, the rate at which the abrasive powder is used, the working distance between nozzle and mask and other relevant factors, abrading actions having the requisite precision can be performed. No difficulty has been experienced, for example, in controlling the formation of recesses 22 in the comb-like ribs 14 so that they do not break through the solid upper portions of these ribs.

For holding the mask 10 in intimate contact with the substrate, several methods may be employed, depending upon the size of the mask and the material of which it is constructed. If the mask is relatively small, it can be satisfactorily secured to the substrate by peripheral clamping devices. For a larger mask, it may be preferred to use an electromagnetic or electrostatic holding means to insure intimate contact between mask and substrate. In the case of graphite masks, satisfactory results have been achieved by applying electrostatic potential between the mask and an electrode positioned beneath the substrate, thereby creating an electrostatic attraction between the mask and the substrate.

There have been shown and described herein a novel mask structure and methods of producing the same which will greatly facilitate the production of deposition patterns upon substrates, particularly where such patterns involve many closely spaced elements as in the metallization of gas panels, for example. By utilizing the raised rib structure 14 with its recessed clearance openings 22, there is provided a mask which has the requisite thinness and freedom from obstructions needed for accurately defining the pattern that is to be deposited through the mask openings and yet is sufficiently rigid to prevent unwanted displacements of parts which otherwise would lack the necessary rigidity, such as the dividers 18 separating the slots 12 through which gas panel conductors are to be deposited. The mask is reusable in many plating operations, making its fabrication cost per plating operation very low.

It will be understood by those skilled in the art that variations and modifications of the disclosed mask and the disclosed methods of constructing the same are possible within the spirit and scope of the invention as defined in the appended claims.

What is claimed is:

1. A vapor deposition mask comprising an integral body of material having a web reinforced by at least one rib,
   the web having a thickness small compared with that of other portions of said mask and adapted to seat against the surface upon which vaporized material is to be deposited through said mask,
   openings extending through said web to define the deposited pattern, at least some of said openings being positioned close to each other so that between each such pair of adjacent openings there is an intervening part of said web having relatively small cross-sectional size and little inherent rigidity,
   each reinforcing rib having a thickness at least three times that of said web and extending across one or more of said openings therein,
   at least some of said openings extending from a point on one side of said rib to a point on the other side of said rib,
   the portion of said rib which bridges each of said openings being recessed so that such opening is effectively extended from said web into said rib to a depth substantially exceeding the web thickness, thus providing a raised bridge portion in said rib above each such opening to afford ample clearance for the passage of vaporized material around said rib and through such opening, said rib giving sufficient support to the tenuous portions of said web which are located between or surrounded by openings in said web to hold such web portions against substantial movements relative to each other and the adjacent parts of the mask while the mask is disengaged from said surface, thereby insuring that said mask is usable repetitively in vapor depositing operations notwithstanding the inherent weakness that such tenuous web portions would have in the absence of support by said rib.

2. The mask of claim 1 in which at least some of said openings are elongated narrow slots very closely spaced, each such slot and the extension thereof into any of the ribs bridging that slot having a combined depth which is a major portion of the total thickness through the unslotted portion of such rib.

* * * * *